United States Patent
Neckers et al.

(10) Patent No.: US 6,200,646 B1
(45) Date of Patent: Mar. 13, 2001

(54) METHOD FOR FORMING POLYMERIC PATTERNS, RELIEF IMAGES AND COLORED POLYMERIC BODIES USING DIGITAL LIGHT PROCESSING TECHNOLOGY

(75) Inventors: Douglas C. Neckers, Perrysburg; Kathleen G. Specht, Bowling Green; Oleg V. Grinevich, Bowling Green; Alexandre Mejiritski, Bowling Green, all of OH (US)

(73) Assignee: Spectra Group Limited, Inc., Maumee, OH (US)

( * ) Notice: Subject to any disclaimer, the term of this patent is extended or adjusted under 35 U.S.C. 154(b) by 0 days.

(21) Appl. No.: 09/382,889

(22) Filed: Aug. 25, 1999

(51) Int. Cl.$^7$ ..................................................... B05D 3/00
(52) U.S. Cl. ......................... 427/510; 427/512; 427/553; 427/555; 264/401
(58) Field of Search .................................. 427/510, 512, 427/553, 555; 264/401

(56) References Cited

U.S. PATENT DOCUMENTS

| | | |
|---|---|---|
| 3,812,559 | 5/1974 | Spindt et al. |
| 3,818,191 | 6/1974 | Fennema et al. |
| 4,264,152 | 4/1981 | Crane . |
| 4,287,410 | 9/1981 | Crane et al. |
| 4,596,919 | 6/1986 | Cain et al. |
| 4,714,310 | 12/1987 | Peppers et al. |
| 4,752,498 * | 6/1988 | Fudim .................................. 427/510 |
| 4,929,402 | 5/1990 | Hull . |
| 5,004,311 | 4/1991 | Peppers . |
| 5,089,185 * | 2/1992 | Hirano et al. ........................ 427/510 |
| 5,137,800 | 8/1992 | Neckers et al. |
| 5,198,159 * | 3/1993 | Nakamura et al. ................... 427/512 |
| 5,230,986 | 7/1993 | Neckers . |
| 5,236,637 | 8/1993 | Hull . |
| 5,420,441 | 5/1995 | McBride et al. |
| 5,424,838 | 6/1995 | Siu . |
| 5,474,719 * | 12/1995 | Fan et al. ............................. 427/512 |
| 5,493,444 | 2/1996 | Cronin-Golmb et al. |
| 5,512,328 * | 4/1996 | Yoshimura et al. .................. 427/512 |

(List continued on next page.)

FOREIGN PATENT DOCUMENTS

| | | |
|---|---|---|
| 3220015 | 3/1983 | (DE) . |
| 438316 | 8/1996 | (EP) . |
| 7012537 | 1/1995 | (JP) . |
| WO 93/13916 | 7/1993 | (WO) . |
| WO 94/07329 | 3/1994 | (WO) . |
| WO 98/00980 | 1/1998 | (WO) . |
| WO 98/03021 | 1/1998 | (WO) . |
| WO 98/06560 | 2/1998 | (WO) . |

OTHER PUBLICATIONS

"DLP A Texas Instruments Technology, The State of the Art in Projection Display, An Introduction to the Digital Light Processing (DLP) Technology" Texas Instruments, 1996 No Month.

"Formation of Multicolor Polymeric Objects by Laser–Initiated Photopolymerization", Shou et al., The Society for Imaging Science and Technology, pp. 18–26 Jan./Feb. 1995.

Primary Examiner—Marianne Padgett
(74) Attorney, Agent, or Firm—Thompson Hine & Flory LLP

(57) ABSTRACT

A method for precisely and efficiently creating three dimensional bodies, relief images or patterns, colored bodies, or a combination of these using photopolymers, photocolorizable polymers or photoresponsive coatings, in one irradiation step as disclosed. In particular this invention describes a method of generating objects or patterns with differential control of properties (depth, pore size, color, density, mechanical strength, hardness, degree of cross-linking, tackiness, etc.) such that the property varies across the xy array.

26 Claims, 1 Drawing Sheet

U.S. PATENT DOCUMENTS

| | | |
|---|---|---|
| 5,514,519 | 5/1996 | Neckers . |
| 5,536,467 * | 7/1996 | Reichle et al. ............... 427/512 |
| 5,545,367 | 8/1996 | Bae et al. . |
| 5,622,811 | 4/1997 | Ogue et al. . |
| 5,626,919 | 5/1997 | Chapman et al. . |
| 5,658,063 | 8/1997 | Nasserbakht . |
| 5,664,255 | 9/1997 | Wen . |
| 5,677,107 | 10/1997 | Neckers . |
| 5,691,541 | 11/1997 | Ceglio et al. . |
| 5,870,176 | 2/1999 | Sweatt et al. . |

\* cited by examiner

METHOD FOR FORMING POLYMERIC PATTERNS, RELIEF IMAGES AND COLORED POLYMERIC BODIES USING DIGITAL LIGHT PROCESSING TECHNOLOGY

BACKGROUND OF THE INVENTION

The present invention relates to a method for creating three dimensional bodies, relief images or patterns and colored bodies, or a combination of these, using photopolymers or photocolorizable polymers. In particular, the invention describes a method for generating three-dimensional and colored objects using a digital light processing technique to selectively image a volume or "voxel" of photopolymer (liquid, gel or solid) and/or photocolorizable composition to form a solid polymer with differential control of the properties (depth, color density, mechanical strength, hardness, cross-linking, functional group conversion, tackiness, etc.) such that the selected property varies across the xy array. Any property of the material that is sensitive to the degree of cure of the polymer can be differentiated across the xy array. Other properties such as the selective formation of color may also be differentiated using this technique. In addition, this invention describes a method of forming polymeric images or patterns without the use of a separate mask.

The use of photopolymerizable resins to create patterns is known. One process for generating polymeric patterns, requires making a mask either through photographic techniques on film or ionographic techniques on glass. The mask is placed between a radiation source such as a UV or visible lamp and the photopolymeric material (liquid, gel or solid) such that the desired light pattern passes through the mask to generate a solid polymer in the desired pattern. These mask techniques are used in photoresists as well as for making 3D objects.

Additionally, methods for creating solid three-dimensional objects based on stereolithography and additive fabrication processes are also known. The stereolithography process is based on the technique of successively building up cross-sectional "layers" of a photocurable resin that have been selectively cured using lasers or other actinic radiation, as described fully in U.S. Pat. Nos. 4,929,402 and 5,236,637 to Hull. Briefly, a prior art stereolithographic apparatus is comprised of a vat of liquid polymer, a platform positioned in the vat that may be precisely lowered in a stepwise manner, and a device for selectively directing actinic radiation to the surface of the polymer. The platform is positioned near the top of the vat so that a thin layer of a polymerizable composition coats the surface of the platform. Actinic radiation, generally in the form of laser light, is selectively directed to the top of the platform in a pattern corresponding to a cross-section of the object being created. Accordingly, the composition is polymerized in the desired pattern thereby creating a single cross-sectional "slice" of the object. The platform is then lowered a precisely measured distance and the process is repeated, continually building up cross-sectional layers of the object, until the desired object is fabricated.

Several innovations have been made over the last few years which improve upon this basic method in various ways. While most of the fabrication methods are based on laser irradiation techniques, there are also fabricators available from Cubital (Israel) which utilizes a mask and broad spectrum UV lamp. Additionally, in our U.S. Pat. Nos. 5,514,519, 5,677,107 and U.S. application Ser. No. 08/603,642 filed Feb. 20, 1996 we describe methods for the production of colored three-dimensional objects.

Recent innovations in digital light processing (DLP) technology have provided new tools for use in industry. For example, in WO 98/06560, entitled Apparatus for Automated Fabrication of Three-Dimensional Objects, and Associated Methods of Use owned by SRI International, a stereolithography method is disclosed for making three-dimensional objects using a binary light switch or digital micromirror device (DMD) to selectively photoexpose layers of photopolymerizable compositions. The method disclosed in this application has some advantages over prior art methods in that a laser is not used to provide the actinic radiation to cure the polymer. However, the SRI application is limited to the fabrication of multi-layer objects. It does not disclose a method for varying grayscale and thereby controlling exposure of the photopolymerizable compositions and thus controlling material properties as a function of the xy array, nor does it describe a method for forming bodies having color differentiation.

While stereolithography methods, particularly those based on laser techniques, are effective for making three dimensional objects from very thin layers (typically 25–150 micron layers) they are not effective for thicker layers. Lasers are also expensive, have relatively short lifetimes and high power requirements. Additionally, lasers are somewhat restrictive in that they offer curing only at a single wavelength. A broad spectrum light source could also be used as an irradiation source, and while a filter or monochromator can be used to select a specific wavelength, it is practically impossible to select several different wavelengths or intensities in a defined pattern.

There are several advantages to utilizing a DMD system over other irradiation methods. Higher brightness, higher contrast and higher resolution can be obtained than is possible with a regular projector system. Because the DMD mirrors are reflective, they offer higher light irradiance than a typical LCD based system. Additionally, the DMD based illuminators can project wavelengths closer to the UV (400 nm) than is possible with LCD technology. They are also less expensive to maintain than a laser. In addition, none of the prior art methods disclose a process which allows for substantial control of the materials properties or colorization.

Another characteristic of the DMD technology is that it eliminates the need for a contact mask. While contact masks are used for many irradiation applications, there are several drawbacks to using masks. For one thing masks are expensive and time consuming to make, particularly for detailed patterns in which masks must be inspected and repaired before use. Speed and ease of use are also sacrificed when several masks are required. In addition, some polymer properties vary when photopolymerized in the presence of a contact mask, for example light scattering often occurs with masks leading to polymeric patterns of lower resolution, less sharpness and different surface properties.

Digital masks or images projected from a DMD illuminator have the advantage that they may be easily modified. Another advantage is that they can be used in processes which would be impractical or impossible for use with a contact mask. For example, when a contact mask is used the resin or surface is covered, this prevents contact with another gas, liquid or solid which is important in the subsequent chemical step. Use of a digital mask may speed up the process by allowing what would have been two individual steps to occur simultaneously. A DMD illuminator enables one to vary grayscale, i.e., the intensity or total exposure to radiation at each spot on the exposed surface and thereby control properties in the xy Plane or in the z direction.

Accordingly, it would be desirable to provide a method for creating three-dimensional objects, polymeric relief images and patterns quickly, easily and inexpensively. Additionally, it would be desirable to have a method for creating multicolored three-dimensional objects or patterns having color variations throughout the object.

SUMMARY OF THE INVENTION

In accordance with the present invention, a novel method for precisely and efficiently producing three-dimensional objects and patterns which are differentiated in the xy Plane or in the z dimension is disclosed. Additionally high contrast irradiation images can be used to directly irradiate a photopolymer in a mask-free technique, which is a faster, more efficient method and allows for the introduction of techniques which are not readily achievable with other masking techniques. These objects are accomplished herein by novel application of a programmable array of binary light switches, preferably the DMD from Texas Instruments.

In one objective of this invention, the DMD technology is used to control the properties of three-dimensional objects and patterns. By controlling the formulation of the photopolymerizable composition (liquid, gel or solid), various properties can be obtained. Using this technique, an intensity-controlled or wavelength controlled exposure pattern on the object surface in the x and y coordinates can be achieved. Additionally, the differentiation of the properties in the xy and/or z dimension can be controlled by selecting the grayscale intensity or wavelength for each individual mirror. Thus it is possible to simultaneously control the wavelength or light intensity experienced such that objects which vary in properties such as depth, mechanical strength, hardness, tackiness, degree of cross-linking, gas permeability, solvent permeability, optical transmission properties, etc. throughout are created. Those skilled in the art will recognize that there are a number of other polymeric properties which may vary with light exposure which could be modulated by this technique.

In addition, this invention discloses a method for controlling color formation and/or color density in patterns or objects based on computer-controlled grayscale or wavelength selective irradiation pattern projected onto a photocolorizable material. There are several methods of controlling the formation of two or more colors in an object. In one set of methods, the color formation is triggered by light intensity. In a second set of methods the color control is wavelength dependent. Almost any application in which selection of two or more colors within a polymeric matrix is desired could be controlled by this process, including, but not limited to, stereolithography techniques.

Another object of this invention is the direct irradiation of an image for applications in which the use of a mask would be expensive, difficult, impossible or undesirable. Improvements in polymeric details such as resolution can be achieved in cases where light scattering and diffraction is reduced. In addition, new chemistries can be developed which would be impossible in the presence of a contact mask.

DETAILED DESCRIPTION

Figure 1A:
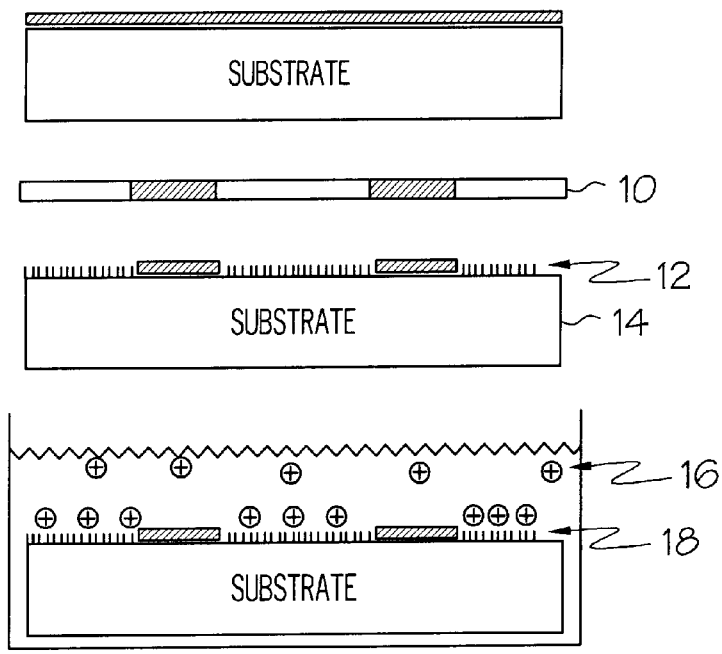
FIG. 1 is an illustration of surface modification using a typical contact mask (1A) and the more efficient method of this invention (1B).

The digital irradiation methodology of the invention allows for control of properties in the xy dimension and/or the z dimension which are not readily controllable by prior art methodology. The application of a programmable array of binary light switches, such as a DMD, allows for the generation of grayscale or intensity modulation as well as color or wavelength modulation. This allows for the application of novel and unique photopolymerizable and photocolorable methodologies.

The irradiation device for the practice of this invention preferably is based on DLP technology which is described in detail in the Technical Bulletin entitled "The State of the Art in Projection Display, An Introduction to the Digital Light Processing (DLP) Technology", copyright 1996 Texas Instruments, the contents of which are incorporated herein by reference, and a summarization of which, in relevant part, is as follows. In brief, DLP technology is a high brightness, high resolution technique composed of a microelectromechanical semiconductor based array of small, fast independently hinged reflective surfaces (or mirrors) the combination of which is known as a digital micromirror device (DMD). The reflective surfaces, each of which represents a single pixel, are 16 $\mu$m square aluminum mirrors that can reflect light in two directions, namely "on" and "off." In the on position, the mirrors reflect light through the optics onto the surface of the object being exposed and the mirrors appear bright. Conversely, when the mirrors are in the off position, the light is reflected out of the optical field and the mirrors appear dark.

Thus when a DMD is combined with a light source, an image processor, and optics, it can be utilized to precisely control the effective intensity of a light source using this binary pulse width modulation technique. Using binary pulse width modulation or other signaling techniques, the amount of time the mirrors are in the off and on positions can be precisely controlled. Additionally, wavelength modulation can be achieved by using a rotating filter wheel. By quickly switching a particular mirror between the on and off positions or pulsing the mirror, the effective intensity of light at the object surface is controlled. When the mirror is continuously on (corresponding to a white pixel) the effective intensity at the object surface is high. However, if the mirror is modulated between the on and off state, the effective intensity (and wavelength if the filter wheel is used) experienced at the object surface can be precisely controlled based on the amount of time the mirror is in the on position. For example, using known DLP technology, a single DMD system can generate 256 gray levels per primary color or 16.7 million different color combinations.

The imaging system will contain a programmable array such as the TI (Texas Instrument) DMD, plus a light source and optical components. It is recognized that other programmable arrays which operate in a fashion similar to the TI DMD may be utilized. The light source may be any number of available sources, including, but not limited to metal halide, tungsten halogen and xenon lamps. A filter wheel may be utilized which contains any combination of filter wavelength ranges as required for the application (e.g., RGB or RGBK). In addition, it is recognized that the arrangements and type of optical components will depend on the particular requirements (for example resolution, magnification and wavelength) of the system. The system may employ scanning of either the illumination system or the photopolymer system. Various software and engineering designs may be employed to control the image design and projection system. The computer system may control a number of functions including image control, illumination time, scanning properties, etc. The illumination system may be configured to project downwards or upwards on the photopolymer.

Conventional techniques in photochemistry and photopolymer chemistry which are familiar to those skilled in the art will be employed in this invention unless otherwise noted. The photoimaging and polymerization steps may employ a liquid, semi-solid or solid photopolymerizable composition which is cured by actinic radiation such as ultraviolet, visible or infrared irradiation such as are disclosed in the series "Chemistry and Technology of UV and EB formulation for Coatings, Inks and Paints" edited by P. K. T. Oldring (1991, SITA Technology, London, England). Photopolymerizable resins are commercially available from such companies as Ciba Geigy Corp. (Los Angeles, Calif.), UCB Radcure (Smyrna, Ga.), E.I.Du Pont De Nemours & Co. (Wilmington, Del.), Shell Chemicals (Houston, Tex.).

The examples disclose several photopolymerizable compositions including commercially available (from Ciba) stereolithography acrylate (SL 5149) and hybrid epoxy-acrylate resins (SL 5170) with visible light initiators added. Other monomers, photoinitiators and components that can be used will be apparent to one skilled in the art. In general, monomers or oligomers or mixtures thereof are used, and may be composed of acrylates, including mono and multifunctional acrylates and methacrylates; epoxies such as epoxycyclohexane derivatives; or hybrid mixtures of both acrylate and epoxides. Such compositions contain appropriate photoinitiators such that light of the desired wavelength activates the initiation of the polymerization reaction. The photopolymerizable compositions may contain fillers. Examples of fillers include pigments, titanium dioxide, UV inhibitors, corrosion inhibitors, metal powders such as stainless steel or silver powders, glass fibers, beads or powders, pre-ceramic fillers, etc.

The photopolymerization step may take place in any number of configurations. In one embodiment of this invention, the photopolymerizable composition is applied to a substrate before imaging. Alternatively the resin could be in a vat or other reservoir. The photopolymerizable composition may be covered with a second substrate such as glass, film or plastic which transmits the desired irradiation wavelengths or the composition may be open to air or other gas. Any substrate may be utilized, including, but not limited to, the following: metal such as aluminum, steel, etc.; wood; glass; fiberglass, ceramics, plastics including polycarbonate, polyethylene, paper, rubber; etc. The substrate may be in form of sheets, cylinders, or almost any other configuration. While both the photopolymer and imaging system may remain stationary during the irradiation procedure, one or the other may also be moving throughout the irradiation. In addition, it is possible to have multiple layers of either the same or varying composition applied during the imaging procedure.

This invention describes a new technique which is based on creating objects or patterns in which the polymeric properties are altered in a controllable fashion to control properties in the xy array and/or z direction. These properties are created using the DMD to control the grayscale and/or wavelength imaging such that the polymer property at any particular pixel can be controlled by careful selection of the projected image shade or effective light intensity. Properties such as polymer depth, tackiness, hardness, degree of cross-linking, solvent or gas permeability may be effectively controlled with the DLP technology. In one method the grayscale intensity is used to govern the light dose received at any particular point, such that at a higher light dose, the polymer would be harder, less tacky, more densely cross-linked or have higher mechanical strength properties than at a lower light dose. The specific property would depend on the formulation.

In one embodiment of this invention objects or patterns which vary in polymer depth at any particular point are created using the DLP grayscale imaging features to control the effective light intensity at specified positions throughout the xy plane. Objects may be generated which vary in depth of two to five millimeters or more. This is a huge improvement considering prior art is generally limited to control of 25 to 150 microns. This is useful for a number of applications, including production of relief images and maps for technical use, for the visually impaired and for decorative purposes. It is also applicable for specific three dimensional bodies which only vary in thickness throughout the z dimension. Two examples follow:

EXAMPLE 1

An acrylate formulation of CibaTool SL 5149 containing 1 w % Irgacure 819 (Ciba) was placed in a small petri dish and covered with a glass slide. A grayscale image of five circles was projected from the TI DLP with modified optics. The circles were each a different shade of gray ranging from dark gray to white. The resin was irradiated with this image for 25 seconds and then the glass slide was removed from the petri dish and washed to remove uncured resin. Attached to the glass slide were five polymeric cylinders, each varying in height as follows: 0.46 mm, 2.69 mm, 3.18 mm, 4.7 mm, 4.48 mm. The thickness of the other cylinders varied in correspondence to the level of gray that was used to image that cylinder.

EXAMPLE 2

The grayscale or color can be used to create relief images, which vary in height and are useful for mapping, decorative and other applications. The acrylate formulation described in Example 1 was applied to a glass slide using a draw down bar. The topical relief image shown was prepared in shades of gray and used to illuminate the resin. Following a 15 second exposure from the DLP, the polymer was processed by washing with solvent and water to remove any remaining liquid resin. What remained was a polymeric relief image-such that no polymer was formed in the dark areas, the gray areas were of intermediate height, and the white areas were highest.

Depending on the pattern being produced and the product which is desired, the photocurable composition may be exposed in different ways. For example, the exposure may be accomplished from the top, above the surface of the resin, from the bottom and in either case, through a substrate such as a plastic, a polymer, or a glass which transmits the light. Additionally, photocurable compositions that adhere to a substrate following curing can also be used. In the case of substrates that are not flat, i.e. cylindrical, spherical, or uneven, etc., the DMD can be used to selectively vary intensity or wavelength in order to obtain the desired cure. For example, in the case of a cylindrical substrate, the DMD can project an image having a lower light intensity near the radial centerline of the cylinder (closest to the light source) and a higher light intensity near the edges of the cylinder (which are farther away from the light source) such that the intensity incident upon the object is "normalized" thereby forming the desired pattern. Accordingly, using these methods, the properties of a cured photocurable composition may be controlled in one irradiation step in accordance with the present invention.

In another manifestation of this invention, an object or pattern is created which varies in the degree of tackiness in a specified manner. The tackiness is created by controlling the light exposure as described above such that some parts of the pattern are tacky and others are tack-free. This is useful for the production of objects which need to adhere to another object or coating only in a specific point or for objects which will be coated with some other material which needs to adhere only to specified patterns. This is also useful for applications such as described here in which a second curing step is applied once the coating or top layer is attached for example by attaching the object generated by the DMD to another object or substrate then exposing it to a broad light source to cure the tacky areas.

EXAMPLE 3

An acrylate based photosensitive pressure sensitive adhesive (PSA) was prepared with 1.5% Irgacure 819 as the photoinitiator. The adhesive was applied to a glass slide. The slide was irradiated from above with a pattern of 3 adjacent squares in the grayscale color of dark gray:white:dark gray. The PSA has characteristics such that high light exposure results in overcuring such that the surface is harder and not tacky, under "normal" irradiation conditions the surface cures to a tacky, adhesive-like surface. The result obtained here were that the two outside squares (gray) were tacky, while the middle square (white) was not as tacky.

Other applications can be manifested by controlling properties such as mechanical strength, hardness or degree of cross-linking using DMD to control grayscale or wavelength. Most of these properties are related to the polymer cure properties which are directly related to other polymer characteristics. For example, solvent permeability or gas permeability which are controlled by polymer pore size are directly related to the degree and type of cross-linking within the polymer matrix. In another example, objects can be created which have selectively designated flexibility or hardness properties, such as an object which has is flexible in one location such as a neck region, but much harder in other locations.

While grayscale intensity control may be used to create some of these polymeric physical properties, in some cases the property may be controlled by irradiation at a different wavelength or wavelength band. One example is the use of a hybrid resin made of at least two sets of components which individually produce polymers of distinct properties. One initiator is present which is activated in one wavelength range such that it induces one set of components to polymerize and form a polymer with the desired property such as a certain hardness or cross-link density characteristic. A second initiator is also present, which triggers polymerization when irradiated at a second wavelength band. This second initiator induces reaction of the second set of components to form a polymer with different characteristics. For example it could produce a flexible polymer or one with very low cross-link density. In this case the digital light technology is used to control the irradiation wavelengths, which trigger different reactions, thus forming a polymeric object with distinct physical properties throughout the xy plane.

Another embodiment of this invention is the use of the digital light technology to control the production of objects based on adaptation of a combinatorial chemistry type approach. This is useful for the production of chemical and biological sensors or test grids for R&D or quality control. Either a single step or multi-step irradiation process may be needed, depending on the application. Chemical combinations or libraries are typically created on a solid support or thin film and have been shown to be useful for a number of applications, including biological and pharmaceutical screening.

A brief overview of the typical combinatorial chemistry approach is described here. The multi-step synthesis is based on techniques developed by Merrifield {as reviewed in Neckers, D. C., Reactive Polymers, 1985, 8, 277.} for solid phase peptide synthesis and further expanded by Fodor et al. {Science, 1991}. In the first step a chemical unit is attached to an active site on the solid matrix or thin film. The chemical subunits, such as peptides or amino acids, contain functional groups which are chemically blocked by photolabile substituents, such as o-nitroaromatic groups. A mask is used to direct the subsequent photochemical step, and the molecules which are irradiated are photochemically deblocked to form a reactive species, for example photodegradation of the nitroaromatic compound leads to generation of $NH_2$ which can subsequently couple to the carboxy terminus of an amino acid, or for detection to a molecule such as fluorescein isothiocyanate (FITC). Combinatorial libraries are created by the step-wise use of the photodegradation step, controlled by unique masks, followed by immersion in the desired reactive component, washing and repeating until a complete library has been created.

In another application of this invention, the object may be built in a multi-step process by first imaging one layer, then either dipping this or covering this with a second layer of the same or different composition and imaging again. This step may be repeated as necessary. It is useful for creation of objects with multiple properties, for example alternate layers which are filled with reinforcers or to impart different chemical properties, such as might be necessary for sensor design.

In addition to the development of an object with variation throughout the z dimension by the use of multiple layers, it is also possible to take advantage of the differential light sensitivity and create objects in one step which vary in property throughout the z dimension. For example, because the light intensity reaching the farthest point is lower than at the top, the object may be of lower cure properties at the bottom than at the top. Thus not only is the pattern differentiated in the xy plane but also within the z dimension as well.

Another embodiment of this invention is the application of this technology where a mask would typically be used. As described above for the combinatorial approach, use of the DLP to generate masks for multi-step processes would be much faster and easier than having to make separate contact masks. In particular, the DLP technology can be used in new areas which would be extremely difficult if not impossible with a contact mask. Three applications, two for the modification of a solid surface and one for in situ grafting will be described.

The first uses grayscale to modify the color of a surface. The application is described in the publication, Brehmer, Martin et al, Polymer Preprints, 1999, VOL, 534. In this cholesteric liquid crystal application, a layer of a copolymer is created which contains the chiral compounds described by Brehmer which are sensitive to light intensity such that different colors are produced by reflection as a function of the light intensity received. For example a polymer which is selectively colored blue, green and red is created by irradiating with 365 nm light through a grayscale mask containing blocks of dark gray, medium gray and white respectively The DLP could be used to very easily create such masks at the desired grayscale intensity and perform the irradiation in one step.

Second, an application which illustrates the use of this invention to perform a surface modification in a way which is not possible with a typical contact mask procedure is described. A polymer coating is applied to the solid surface of a substrate. Typically this polymer is either hydrophilic or hydrophobic, but can be chemically modified by light activated chemistry. An example of one such system is shown below:

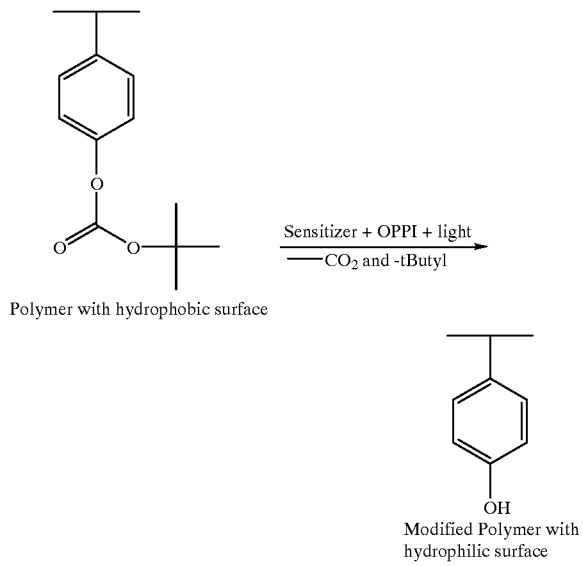

Polymer with hydrophobic surface

Modified Polymer with hydrophilic surface

For this illustration a hydrophobic polymer is used. Typically a contact mask would be applied to the surface, and irradiated in the presence of a cationic sensitizer such as an iodonium salt contained in the polymeric layer. The acid generated by the light activation step causes release of certain end groups such as tertiary butyl groups and carbon dioxide to generate more hydrophilic phenolic derivatives. This type of process is most often utilized in photoresist manufacturing. The treated polymer is then submerged or coated with the agent which can attach only to one of the surfaces, for example the hydrophilic areas for selective modification. The use of the mask to selectively irradiate a pattern, results in a pattern of hydrophilic and hydrophobic areas on the polymer surface which is useful as a template for a number of applications including printing ink distribution or production of self-assembled monolayers.

Figure 1B:
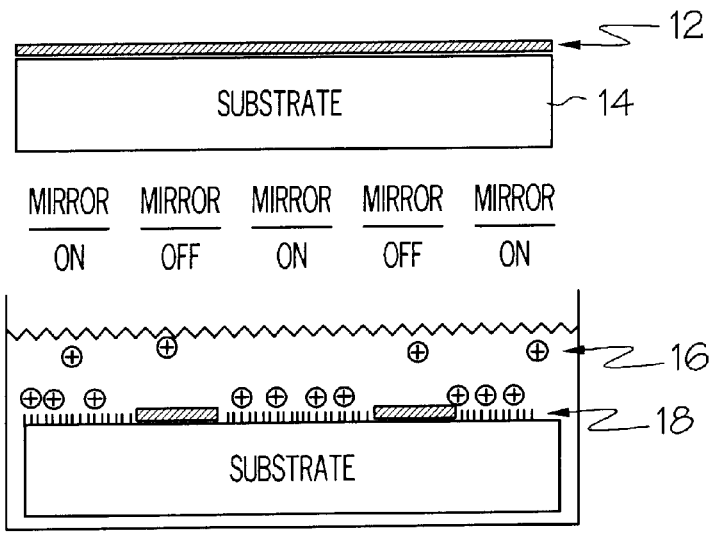

If the DLP technology is applied to this application, then it would be possible to conduct this procedure in fewer steps than is possible with a contact mask (see FIG. 1). As illustrated in FIG. 1A, when a contact mask is used for this application, the process requires at least two steps, first a mask 10 is applied to a polymer surface 12 on a substrate 14 then the irradiation step takes place. This is followed by application of the modifying agent, e.g., by immersing the exposed material in a bath 16 which reacts with the hydrophobic or hydrophilic region. As shown in FIG. 1B, the DLP technology allows the polymer coated substrate 14 to be submerged in a bath 16 which contains the modifying agent. Using DLP technology, the image of the mask can be focused through the modifying agent, assuming the modifying agent does not absorb the irradiation wavelengths, onto the polymer surface 12, so that selective surface modification occurs in the presence of the modifying agent. Attempts to combine these steps in a typical contact mask application results in unacceptable image distortion and loss of resolution because of the inability to focus the image on the polymer surface.

A second illustration of the use of this invention for in situ grafting applications is described. Controlled grafting of polymer films onto solid substrates is expected to be useful in a number of applications because it allows for the production of polymer films with thickness' in the range of molecular dimensions. Prucker, O and J. Ruhe, Langmuir 1998, 14, 6893–6898 report on a system of building polymer layers through a series of self-assembled monolayers using thermal initiators. The drawback to their system is the fact that they use thermal initiators attached across the substrate, therefore, it is not possible to achieve spatial lateral resolution, but only complete polymer film coverage.

The use of light activated initiators allows for selective pattern formation of the grafting polymerization process. This concept has been illustrated by Mejiritski, A., (Ph.D. Dissertation, Bowling Green State University, 1997) utilizing novel photosensitive benzophenone-ammoniumborate polymers. The substrate with the photoinitiator molecule attached, is immersed in the polymerizable media. An image or mask was used for the light exposure process to achieve a grafted polymeric film in the desired pattern. As described above, use of the DLP technology described in this invention makes this easier to use and results in better resolution and image quality at the substrate surface than is achievable with a contact mask. This is described in more detail in Example 4.

EXAMPLE 4

A specific example of the chemistry utilized for this application is described. Polymer form (1) shown below was immobilized by spin-coating onto a silicon substrate, then immersed in a solution of acrylonitrile in toluene. A low resolution contact mask was attached to the outside of the container and the sample was irradiated through the mask. Light initiates the photoinduced electron transfer reaction yielding cleavage and rearrangement of (1) to form (2) which contains a tertiary amine end group and a benzophenone-like species which can then react via a radical polymerization process with the acrylonitrile.

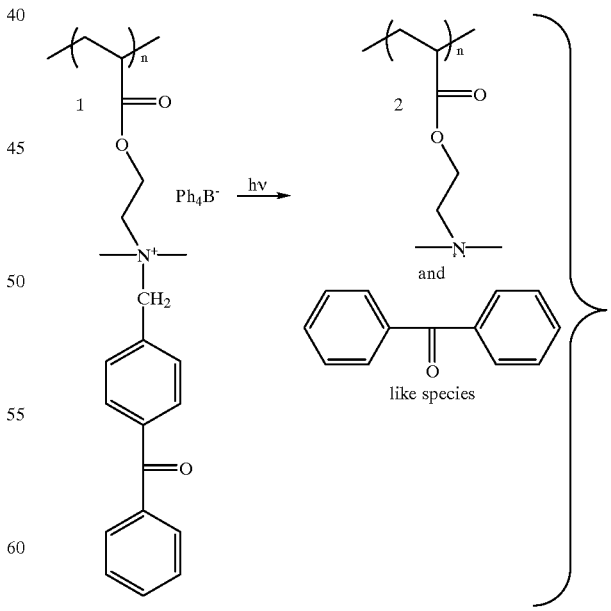

Using scanning electron microscopy and atomic force microscopy, it was shown that the polymeric film (graft)

only occurs in areas which were exposed to light. Modification of specific chemical moieties will allow adaptation to the longer wavelengths of light employed in most DLP applications.

Another embodiment of this invention which employs the grayscale intensity or wavelength selectivity features of the DMD is the selective colorization of objects, coatings and the like. Liquid photopolymerizable compositions and photo-colorable compositions are known. As described fully in U.S. Pat. Nos. 5,514,519 and 5,677,107 to Neckers, U.S. patent application Ser. No. 08/603,642 by Ren, et al., filed Feb. 20, 1996. There are many available photoresponsive compositions and chemistries which exhibit changes in absorption spectra (color) following exposure to actinic radiation having varying intensity or wavelength. In particular, as discussed in the paper "Formation of Multicolor Polymeric Objects by Laser-initiated Photopolymerization," by Hansen Shou and D. C. Neckers, *J. Imaging Sci. & Tech.*, Vol. 39, No. 1, January/February 1995, pp. 18–26, the contents of which are incorporated herein by reference, several coloring schemes can be used to color polymeric objects.

Five schemes have been found to be particularly useful for producing colored polymeric objects. These are briefly described below. In addition, it can be recognized that various permutations and combinations of these five schemes may be possible.

Scheme (1) consists of a photopolymerizable composition containing an acid sensitive color precursor and an onium salt or other acid generator, which is selectively colored by wavelength or intensity control. Typical color precursors includes lactone dyes, such as crystal violet lactone, malachite green lactone and the Copikem™ dyes available from Hilton Davis. At low light doses, a polymer is formed which is essentially colorless or lightly colored, at high light doses the color precursors are activated and the polymer is selectively colored. This reaction may also be controlled by varying the wavelength such that polymerization is activated at one wavelength and color formation is activated at a second wavelength. The result is typically a colorless polymer with selectively colored images within.

Scheme (2) consists of a photopolymer system containing a color precursor which is not acid sensitive and an onium salt which are selectively colored by wavelength or intensity control. While this is similar to scheme (1), the color precursor is not sensitive to acid; as demonstrated by phenolphthalein. The polymer product is similar to that described for scheme (1).

In Scheme (3) a photochromic material in combination with a photocurable composition is used. These color precursors are directly activated by light, often undergoing a cis/trans isomerization to form a derivative which is colored. Benzospiropyrans such as merocyanine derivatives as described in U.S. Pat. No. 5,230,986 are useful examples. The polymeric image is as described in scheme (1).

Scheme (4) consists of a polymerizable composition containing two color precursors which change color at different rates in the presence of an oxidizing agent and light. Again, this can be controlled either by wavelength selectivity or intensity. At low light doses polymerization occurs and the first color is formed at about the same rate, such that a colored polymer is formed. One example is the use of malachite green leucobase and a sulfonium salt which generates a green polymer. At higher light doses, the original color bleaches, while the second color precursor (for example, basic fuchsin leucontrile which turns fuschia) is activated. Proper selection of light intensity results in a polymer which contains two colors, for example green and fuschia.

In Scheme (5) a combination of photobleachable initiators is used which are wavelength or light dose sensitive. If the photoinitiators are wavelength sensitive, then irradiation at wavelength 1 produces a polymer in which initiator 1 is bleached and the polymer is the color of initiator 2, while irradiation at the second wavelength generates a polymer which is the color of residual initiator 1. Irradiation at both wavelength 1 and 2 would generate a colorless polymer. The result is an image selectively colored with 2 or 3 colors. Using an intensity controlled scheme a polymer of only two colors (color 2 and initial color or colorless) are possible, since bleaching of initiator 1 occurs at low and high intensity.

In one method of selective colorization, the grayscale characteristics of the DLP system are utilized. The irradiation is performed either with white light (all wavelengths) or at one wavelength band, and the color selection is performed by the appropriate selection of light intensity as controlled by the grayscale shade. This can be used to form patterns or images with two or more colors, generally the initial color of the resin and the color formed at a higher intensity. The product may be a) a layer selectively imaged in two colors; b) a layer selectively imaged in two colors with variation in the intensity or shade of the color; or c) an image of selectively variable thickness in two colors, such that thicker layers have higher color intensity when viewed in the xy plane.

EXAMPLE 5

In an example which utilizes scheme 1, a cationic initiator, such as Irgacure 261 (Ciba), is used in place of the onium salt, to induce color formation, most likely by generation of acid in the presence of a lactone color precursor, such as Copikem 7 (Hilton Davis, Ohio). The acrylate resin was formulated to include the acrylate initiator system 0.05 w % HNu-470 (Spectra Group Limited, Maumee, Ohio), 0.15w % CD 1012 (diaryliodonium hexafluoroantimonate from Sartomer, Exton, Pa.) and 0.2 w % DIDMA (2,6-diisopropyl-N,N-dimethylaniline (Aldrich, Milwaukee, Wis.) plus 0.05 w % Copikem 7 and 0.05 w % Irgacure 261. Polymerization and color formation were induced by irradiation with light at different intensities using a "star" pattern, such that one star is gray and thus at lower light intensity than the other star which is white. A 2 mm layer of resin on a glass slide was irradiated from above using the DLP. One sample was irradiated for 30 s ec and the other for 90 s ec, followed by washing. In both cases the area imaged with the gray star gave a good clear, colorless star, while in the 30 s ec case the area imaged with the white star gave a good polymer which was very faint purple and at 90 s ec the polymer was a darker shade of purple. Similar results were obtained when 1% Irgacure 819 was used as the initiator in place of the HNu-470 composition. It is shown that a selectively colored object or pattern may be created when combining the DMD with grayscale imaging to control the light intensity with an appropriate photocolorizable composition.

EXAMPLE 6

In another example which utilizes scheme (5) a combination of photobleachable colored photoinitiators are imaged using different colors or wavelengths of light in an image projected by the digital light projector. The acrylate resin contained 0.15 w % HNu-635, 0.05 w % HNu-470, 1.5 w % DIDMA and 0.3 w % OPPI (octyloxyphenyl phenyl iodonium salt from GE Silicones, Waterford, N.Y.). The original photopolymer was a combination of the orange and blue initiators forming a dark green color. The resin was layered between two glass slides at a thickness of 1 mm. The DLP was used to image a pattern of red and blue squares onto one surface of the sample. The intensity of the blue pattern was adjusted to be lower than that of the red pattern to compensate for illumination intensity and initiator sensitivity. Following irradiation the resulting solid polymer was green in the background areas with yellow squares in the areas of the imaged red pattern and blue squares in the areas of the imaged blue pattern. Adjustments to the concentrations and intensities can be used to optimize the color pattern, but in this case at least 3 colors were clearly distinguished in the polymeric image.

In accordance with another embodiment of the invention, the DMD can be utilized to form multi-shaded polymers in one step. In this example, a colorless liquid resin is irradiated with a projected image which contains multiple shades of gray. A photo-colorable photopolymer is used which increases in color with high light intensity. For example, with low light doses (dark gray shades) a colorless polymer is formed, while at higher light doses (white or light gray shades) the polymer turns color. The degree of color formation or color density is light dose dependent. This is useful in any application such as described above in which formation of colored patterns which vary in grayscale within the non-colored polymer is desirable.

EXAMPLE 7

In this example, the colorization of which is based on Scheme 2, a photocolorable photopolymer which turns blue with high light intensity at 400–430 nm was made using CibaTool Stereolithography resin SL 5149 (acrylate) containing 1.0 w % Irgacure 819, 0.35 w % crystal violet lactone (blue color precursor) and 2 w % iodonium salt. A thin film (100 $\mu$m) appears colorless to the human eye. A 100 $\mu$m thick sample of liquid resin was prepared between glass slides using appropriate spacers. The sample was irradiated with an image from the DLP projector which consisted of four rectangles, one dark gray, one medium gray, one light gray and one white. The sample was placed under the DLP with a modified optical arrangement and irradiated for 4 minutes. Following irradiation, the polymer was removed from the glass slide. The result was a rectangular polymer which varied in color intensity; such that there was one colorless rectangle which corresponded to the dark gray projection image, a dark blue rectangle which corresponded to the white projection image and two intermediate blue rectangles whose intensity was inversely proportional to the shade of gray in the projected image. The same experiment was repeated using a petri dish of liquid resin at a shorter focal length. In this case a 1.5 minute irradiation produced a 1 mm thick polymer containing series of four differentially colored rectangles with the color properties described above.

Thus, by combining these or other intensity or wavelength selective color chemistries, with the intensity precision on a point to point basis that is afforded by the DMD, it is possible to vary light intensity to create objects that are differentially colored in either different shades of grayscale or varying colors.

Accordingly, all of these schemes can be used as herein described to create three dimensional bodies or patterns, colored bodies or patterns, or both using DLP techniques in one or two steps.

While the invention has been described herein with reference to specific embodiments thereof, it is to be understood that the invention is not limited to the specific embodiments and that changes may be made therein without departing from the scope of the invention.

What is claimed is:

1. A method for forming a three-dimensional object or a three-dimensional pattern, having a property with a desired three-dimensional variation in a coordinate system defined by an xy plane and a z dimension, the method consisting essentially of the steps of:

selecting a photoresponsive or photocurable composition having a photoresponse or photocure rate which is a function of the intensity and/or dependent on the wavelength of actinic radiation incident on the said composition, selecting said composition such that the desired three-dimensional variation of the property is inducible in proportion to the intensity and/or as a function of the wavelength of the actinic radiation incident on the composition, and selectively exposing a single-layer volume of said composition to different wavelengths and/or different intensities of the actinic radiation thereby developing the desired three-dimensional variation of the property within the exposed volume of said composition, wherein the intensity and/or wavelength of said actinic radiation incident on said composition is controlled by a programmable array of binary light switches to create a photoresponsed or photocured volume of said composition which is the three-dimensional object, or the three-dimensional pattern, having the property with the desired three-dimensional variation.

2. The method of claim 1 wherein the array of the binary light switches is a digital mirror device.

3. The method of claim 2 wherein the digital mirror device includes a digital light projector that is capable of emitting actinic radiation in the ultraviolet, visible and/or near infrared ranges.

4. The method of claim 1 wherein the selectively-exposing step includes selectively exposing said volume of said composition to said actinic radiation from above a surface of said composition.

5. The method of claim 4 wherein said composition is on a substrate.

6. The method of claim 5 wherein said substrate is selected from the group consisting of polymers, glass, metal, wood, paper.

7. The method of claim 5 wherein said substrate is flat or cylindrical.

8. The method of claim 1 wherein the selectively-exposing step includes selectively exposing said volume of said composition to said actinic radiation from above or below a surface of said composition through a substrate material such that said substrate material is from the group consisting of polymers, glass or other material which transmits the actinic irradiation.

9. The method of claim 1 wherein said composition is selected from the group consisting of liquid, semi-solid or solid monomers or liquid, semi-solid or solid oligomers.

10. The method of claim 9 wherein said composition is selected from the group consisting of acrylate and hybrid acrylate-epoxy compositions.

11. The method of claim 1 wherein said composition has a photoresponse or photocure rate proportional to the intensity of the actinic radiation, and said binary light switches are modulated to vary the intensity of the actinic radiation.

12. The method of claim 11 wherein said selectively-exposing step further comprises the step of exposing said composition to a sufficient amount of the actinic radiation such that the desired three-dimensional variation of the property has a depth in the z coordinate of at least 0.15 mm.

13. The method of claim 11 wherein said selectively-exposing step is used to make relief images.

14. The method of claim 11 wherein said selectively-exposing step forms three dimensional objects or patterns having differential tackiness properties throughout the xy plane.

15. The method of claim 11 wherein said selectively-exposing step forms three dimensional objects or patterns having differential flexibility or hardness throughout the xy plane.

16. The method of claim 11 wherein said selectively-exposing step forms three dimensional objects or patterns having differential sensitivity to biological or chemical agents throughout the xy plane.

17. The method of claim 1 wherein said composition includes a photocurable component and includes a photo-colorizable component which yields color in relation to the intensity of incident actinic radiation on said composition, such that selectively exposing with differential control of the intensity forms three dimensional objects or patterns having a predetermined color differentiation.

18. The method of claim 17 wherein said selectively-exposing step further comprises the step of exposing said composition to a sufficient amount of actinic radiation such that the composition is selectively changed from colorless to colored with light exposure.

19. The method of claim 17 wherein said selectively-exposing step further comprises the step of selectively exposing portions of said volume of said composition to a sufficient amount of actinic radiation such that said portions of said volume of the composition are a different color following exposure than prior to exposure.

20. The method of claim 18 wherein said photocurable component has a cure rate proportional to the intensity of actinic radiation on said composition and wherein said photocolorizable component includes color-initiators that induce colorization proportional to an intensity of incident actinic radiation on said composition such that at lower intensities one color is formed in parallel with curing of the composition and at higher intensities a different color is formed such that selectively exposing with differential control of the intensity forms a colored composition having a desired color differentiation throughout the composition.

21. The method of claim 1 wherein said composition is photocurable and cures at a rate proportional to a grayscale intensity at one wavelength or wavelength band incident said composition and said property is altered in response to the intensity of the actinic radiation at a second wavelength or wavelength band incident said composition.

22. The method of claim 21 wherein said selectively-exposing step forms a three dimensional object or pattern having differential flexibility or hardness throughout the xy plane.

23. The method of claim 1 wherein said composition is photocurable and includes a photocolorizable component and said composition cures at a rate proportional to the intensity of one wavelength or wavelength band of the actinic radiation incident said composition and the photocolorizable component induces colorization at a rate proportional to the intensity of a second wavelength or wavelength band of the actinic radiation incident said composition.

24. The method of claim 23 wherein said selectively-exposing step further comprises the step of exposing said composition to a sufficient amount of actinic radiation such that the composition is changed from colorless to colored with light exposure.

25. The method of claim 23 wherein said selectively-exposing step further comprises the step of exposing said composition to a sufficient amount of actinic radiation such that selected areas of the cured composition are a different color following exposure than said composition was before exposure.

26. A method for forming a three-dimensional object, or a three-dimensional pattern, having a property with a desired three-dimensional variation in a coordinate system defined by an xy plane and a z dimension, the method consisting essentially of the steps of:

selecting a photoresponsive or photocurable composition having a photoresponse or photocure rate which is a function of the intensity and dependent on the wavelength of actinic radiation incident on the said composition, selecting said composition such that the desired three-dimensional variation of the property is inducible in proportion to the intensity and as a function of the wavelength of the actinic radiation incident on the composition, and selectively exposing a single-layer volume of said composition to different wavelengths and different intensities of the actinic radiation thereby developing the desired three-dimensional variation of the property within the exposed volume of said composition, wherein the intensity and wavelength of said actinic radiation incident on said composition is controlled by a programmable array of binary light switches to create a photoresponsed or photocured volume of said composition which is the three-dimensional object, or the three-dimensional pattern, having the property with the desired three-dimensional variation.

* * * * *